(12) United States Patent
Guha et al.

(10) Patent No.: US 8,609,488 B2
(45) Date of Patent: Dec. 17, 2013

(54) METHODS OF FORMING A VERTICAL TRANSISTOR AND AT LEAST A CONDUCTIVE LINE ELECTRICALLY COUPLED THEREWITH

(71) Applicant: Micron Technology, Inc., Boise, ID (US)

(72) Inventors: Jaydip Guha, Boise, ID (US); Shyam Surthi, Boise, ID (US); Suraj J. Mathew, Boise, ID (US); Kamal M. Karda, Boise, ID (US); Hung-Ming Tsai, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/869,112

(22) Filed: Apr. 24, 2013

(65) Prior Publication Data
US 2013/0237023 A1     Sep. 12, 2013

Related U.S. Application Data

(62) Division of application No. 13/031,829, filed on Feb. 22, 2011, now Pat. No. 8,450,175.

(51) Int. Cl.
*H01L 21/8238* (2006.01)
*H01L 21/336* (2006.01)

(52) U.S. Cl.
USPC ........... 438/259; 438/209; 438/257; 438/696; 257/E21.375; 257/E21.41

(58) Field of Classification Search
USPC .......... 438/209, 257, 259, 696; 257/E21.375, 257/E21.41
See application file for complete search history.

(56) References Cited

U.S. PATENT DOCUMENTS

| | | |
|---|---|---|
| 3,562,022 A | 2/1971 | Shifrin |
| 3,865,624 A | 2/1975 | Wilde |
| 4,673,962 A | 6/1987 | Chatterjee et al. |
| 4,764,394 A | 8/1988 | Conrad |
| 4,920,390 A | 4/1990 | Fuse et al. |
| 5,374,456 A | 12/1994 | Matossian et al. |
| 5,627,390 A | 5/1997 | Maeda et al. |
| 5,672,541 A | 9/1997 | Booske et al. |
| 5,828,094 A | 10/1998 | Lee |
| 5,897,363 A | 4/1999 | Gonzalez et al. |
| 6,137,713 A | 10/2000 | Kuroda et al. |
| 6,329,686 B1 | 12/2001 | Lowrey et al. |

(Continued)

OTHER PUBLICATIONS

U.S. Appl. No. 12/914,346, filed Nov. 1, 2010, Heineck et al.

(Continued)

*Primary Examiner* — Thanh V Pham
(74) *Attorney, Agent, or Firm* — Wells St. John, P.S.

(57) ABSTRACT

Trenches are formed into semiconductive material. Masking material is formed laterally over at least elevationally inner sidewall portions of the trenches. Conductivity modifying impurity is implanted through bases of the trenches into semiconductive material there-below. Such impurity is diffused into the masking material received laterally over the elevationally inner sidewall portions of the trenches and into semiconductive material received between the trenches below a mid-channel portion. An elevationally inner source/drain is formed in the semiconductive material below the mid-channel portion. The inner source/drain portion includes said semiconductive material between the trenches which has the impurity therein. A conductive line is formed laterally over and electrically coupled to at least one of opposing sides of the inner source/drain. A gate is formed elevationally outward of and spaced from the conductive line and laterally adjacent the mid-channel portion. Other embodiments are disclosed.

23 Claims, 16 Drawing Sheets

(56) References Cited

U.S. PATENT DOCUMENTS

| | | |
|---|---|---|
| 6,417,040 B2 | 7/2002 | Noble |
| 6,492,245 B1 | 12/2002 | Liu et al. |
| 6,504,201 B1 | 1/2003 | Noble et al. |
| 6,563,162 B2 | 5/2003 | Han et al. |
| 6,593,612 B2 | 7/2003 | Gruening et al. |
| 6,600,191 B2 | 7/2003 | Lowrey et al. |
| 6,639,846 B2 | 10/2003 | Nikutta |
| 6,689,660 B1 | 2/2004 | Noble et al. |
| 6,716,727 B2 | 4/2004 | Walther |
| 6,992,349 B2 | 1/2006 | Lee et al. |
| 7,052,941 B2 | 5/2006 | Lee |
| 7,074,656 B2 | 7/2006 | Yeo et al. |
| 7,099,174 B2 | 8/2006 | Thompson et al. |
| 7,129,538 B2 | 10/2006 | Lee et al. |
| 7,166,479 B2 | 1/2007 | Zhu et al. |
| 7,179,703 B2 | 2/2007 | Gonzalez et al. |
| 7,365,384 B2 | 4/2008 | Tran et al. |
| 7,456,068 B2 | 11/2008 | Kavalieros et al. |
| 7,491,641 B2 | 2/2009 | Southwick et al. |
| 7,501,676 B2 | 3/2009 | Doyle |
| 7,518,182 B2 | 4/2009 | Abbott et al. |
| 7,592,212 B2 | 9/2009 | Qin et al. |
| 7,713,823 B2 | 5/2010 | Sung et al. |
| 7,736,969 B2 | 6/2010 | Abbott et al. |
| 7,737,010 B2 | 6/2010 | Qin et al. |
| 7,768,073 B2 | 8/2010 | Wells |
| 7,939,409 B2 | 5/2011 | Figura et al. |
| 7,948,064 B2 | 5/2011 | Barth et al. |
| 2002/0110039 A1 | 8/2002 | Forbes et al. |
| 2003/0096490 A1 | 5/2003 | Borland et al. |
| 2003/0186519 A1 | 10/2003 | Downey et al. |
| 2004/0132232 A1 | 7/2004 | Noble |
| 2004/0195594 A1 | 10/2004 | Tran et al. |
| 2005/0017281 A1 | 1/2005 | Lowrey |
| 2005/0079721 A1 | 4/2005 | Buerger, Jr. et al. |
| 2005/0260838 A1 | 11/2005 | Downey et al. |
| 2006/0017088 A1 | 1/2006 | Abbott et al. |
| 2007/0087574 A1 | 4/2007 | Gupta et al. |
| 2007/0243680 A1 | 10/2007 | Harari et al. |
| 2008/0142931 A1 | 6/2008 | Sasaki et al. |
| 2008/0217655 A1 | 9/2008 | Baumann et al. |
| 2010/0237423 A1 | 9/2010 | Yun et al. |
| 2011/0215408 A1 | 9/2011 | Tang et al. |
| 2011/0220994 A1 | 9/2011 | Parekh et al. |

OTHER PUBLICATIONS

Bernstein et al., Effects of Dopant Deposition on p+/n and n+/p Shallow Junctions formed by Plasma Immersion Ion Implanation, IEEE, 2000, 464-467.

Gras-Marti, "Recoil Implanatation Yields and Depth Profiles", Phys. Stat. Sol. (1) 76, 621-627, 1983.

Oh et al., "Characterization of B2H6 Plasma doping for converted p+ Poly-Si Gate", Ion Imiplantation Technology, 2006 American Institute of Physics, pp. 25-28.

Qin et al., "Comparative Study of Self-Sputtering Effects of Different Boron-Based Low-Energy Doping Techniques", IEEE, vol. 37, No. 9, Sep. 2009, pp. 1760-1766.

METHODS OF FORMING A VERTICAL TRANSISTOR AND AT LEAST A CONDUCTIVE LINE ELECTRICALLY COUPLED THEREWITH

RELATED PATENT DATA

This patent resulted from a divisional application of U.S. patent application Ser. No. 13/031,829, filed Feb. 22, 2011, now U.S. Pat. No. 8,450,175 entitled "Methods Of Forming A Vertical Transistor And At Least A Conductive Line Electrically Coupled Therewith", naming Jaydip Guha, Shyam Surthi, Suraj J. Mathew, Kamal M. Farda, and Hung-Ming Tsai as inventors, the disclosure of which is incorporated by reference.

TECHNICAL FIELD

Embodiments disclosed herein pertain lo methods of forming a vertical transistor and at least a conductive line electrically coupled therewith, to methods of forming memory cells, and to methods of forming arrays of memory cells.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The digit lines may electrically interconnect memory cells along columns of the array, and the access lines may electrically interconnect memory cells along rows of the array. Each memory cell may be uniquely addressed through the combination of a digit line and an access line.

Memory cells may be volatile, semivolatile, or nonvolatile. Nonvolatile memory cells can store data for extended periods of time, in many instances including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

Example volatile memory cells are dynamic random access memory (DRAM) cells. A DRAM unit cell may comprise a transistor coupled with a charge-storage device, such as a capacitor. Other example memory cells may lack capacitors, and instead may utilize electrically floating transistor bodies. Memory which utilizes electrically floating transistor bodies to store data may be referred to as zero-capacitor-one-transistor (0C1T) memory, as capacitor-less memory, or as ZRAM™ (zero capacitance DRAM), and may be formed to much higher levels of integration than DRAM.

One type of component that may be used in memory and other integrated circuitry is a transistor. Such may be oriented vertically, horizontally, a combination of vertically and horizontally, diagonally, or otherwise. Transistor orientation refers to the general direction of current flow through the transistor channel between a pair of source/drains of the transistor. In this document, vertical is a direction generally orthogonal to a primary surface relative to which a substrate is processed during fabrication and which may be considered to define a generally horizontal direction.

DETAILED DESCRIPTION OF EXAMPLE EMBODIMENTS

Embodiments of the invention encompass methods of forming a vertical transistor and at least a conductive line electrically coupled therewith. Accordingly, such includes fabrication of integrated circuitry including such components, with an array of memory cells being one such example. Embodiments of the invention also encompass methods of forming a vertical transistor and at least a conductive line electrically coupled therewith formed as a memory cell. Example such methods are described initially with reference to FIGS. 1-9 with respect to a substrate fragment 10 in-process.

Figure 1:
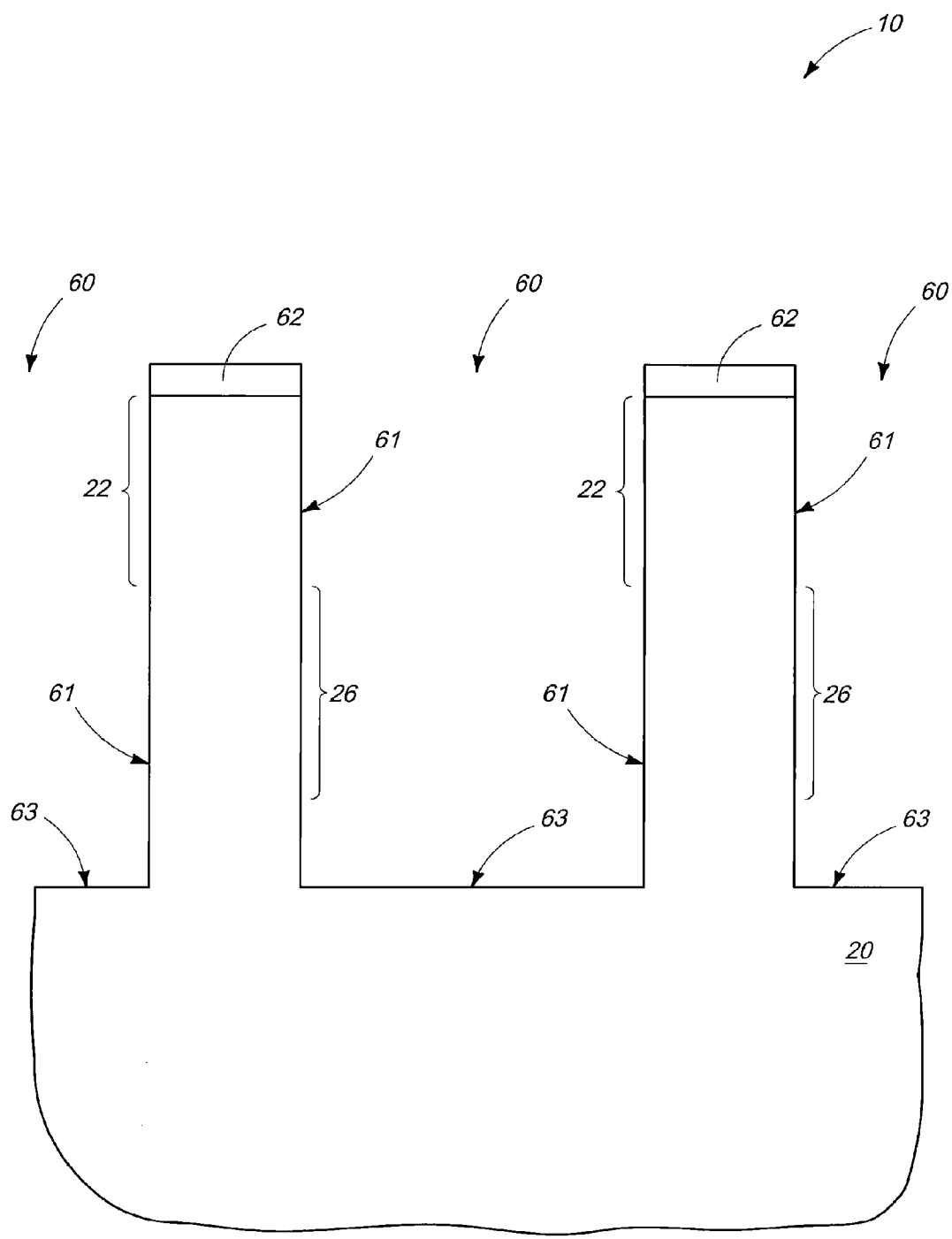
FIG. 1 is a diagrammatic sectional view of a substrate fragment in process in accordance with an embodiment of the invention.

Referring to FIG. 1, substrate fragment 10 is a semiconductor substrate comprising semiconductive material 20 into which trenches 60 have been formed. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate material 20 may be homogenous or non-homogenous, and may comprise multiple different composition layers and/or materials. Further, any suitable existing or yet-to-be-developed semiconductive material may be used, with bulk monocrystalline silicon lightly background doped with a p-type conductivity modifying impurity being but one example. Other example semiconductive materials include silicon germanium ($Si_{1-x}Ge_x$) material, gallium arsenide (GaAs) material, or gallium nitride (GaN) material.

By way of example only, trenches 60 may be formed by subtractive etching using a previously-patterned masking material 62 received over semiconductive material 20 as a mask. Masking material 62, by way of example, may comprise photoresist and/or hard masking material. Semiconductive material 20 between trenches 60 respectively comprises an elevationally outer source/drain portion 22 and an elevationally mid-channel portion 26 there-below. In this document, "elevational" and "elevationally" are with reference to the vertical direction relative to a base substrate upon which the circuitry is fabricated. Portions 22 and 26 may or may not be provided with one or more conductivity type dopants at desired finished circuitry concentrations at this point in the process. Trenches 60 may be respectively considered as having opposing sidewalls 61 and a base 63. In one embodiment, such are oriented generally at 90° relative one another, and in one embodiment sidewalls 61 are generally vertical and bases 63 are generally horizontal.

Figure 2:
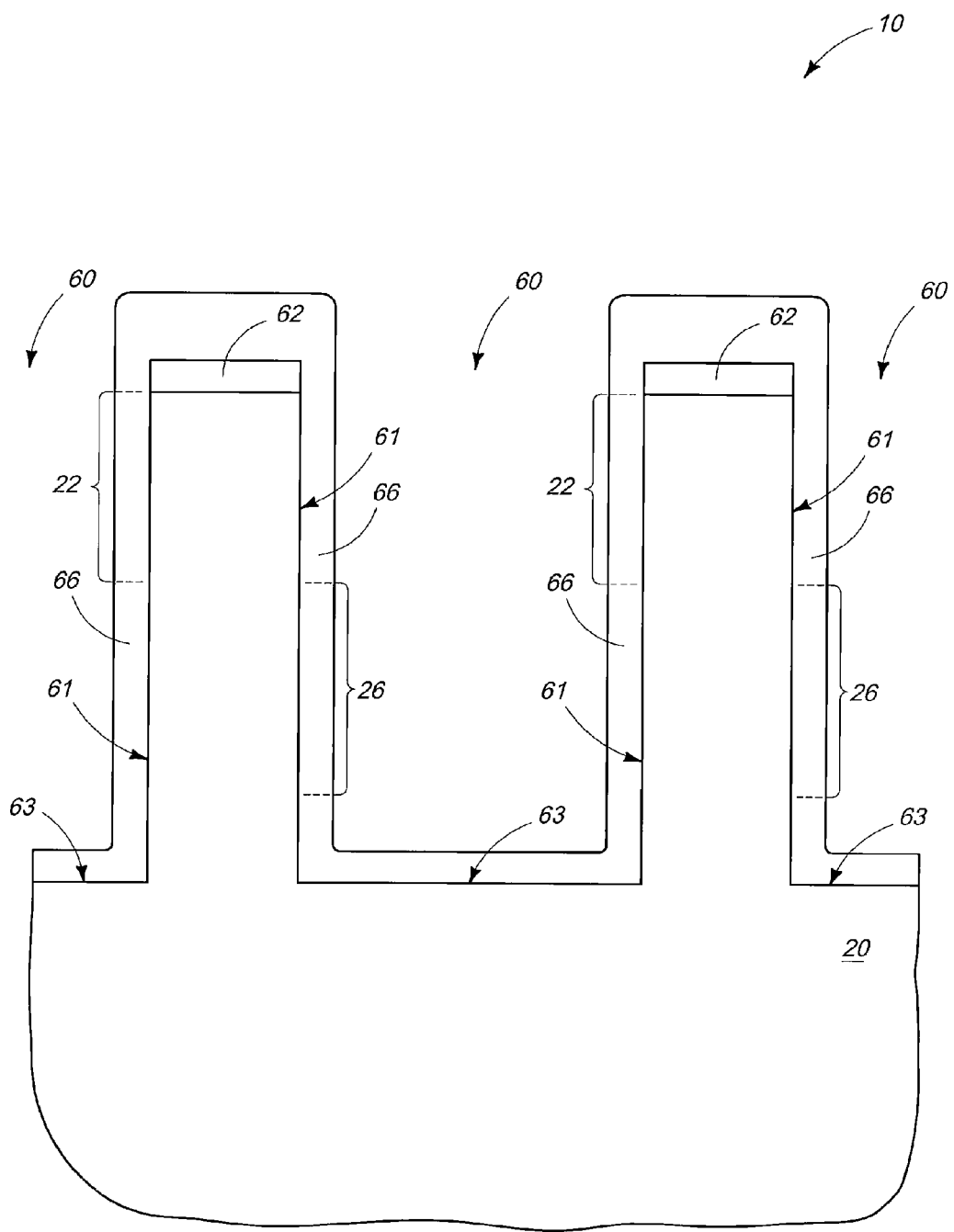
FIG. 2 is a view of the FIG. 1 substrate fragment at a processing step subsequent to that shown by FIG. 1.

Referring to FIG. 2, masking material 66 has been formed in one embodiment laterally over at least some elevationally inner portions of sidewalls 61 and in one embodiment across bases 63 of trenches 60. In one embodiment, masking material 66 is received laterally over all of sidewalls 61, for example as shown. Masking material 66 may or may not be sacrificial. Such may be homogenous or non-homogenous, and may be conductive, semiconductive, and/or dielectric, with silicon nitride being but one example dielectric material.

Figure 3:
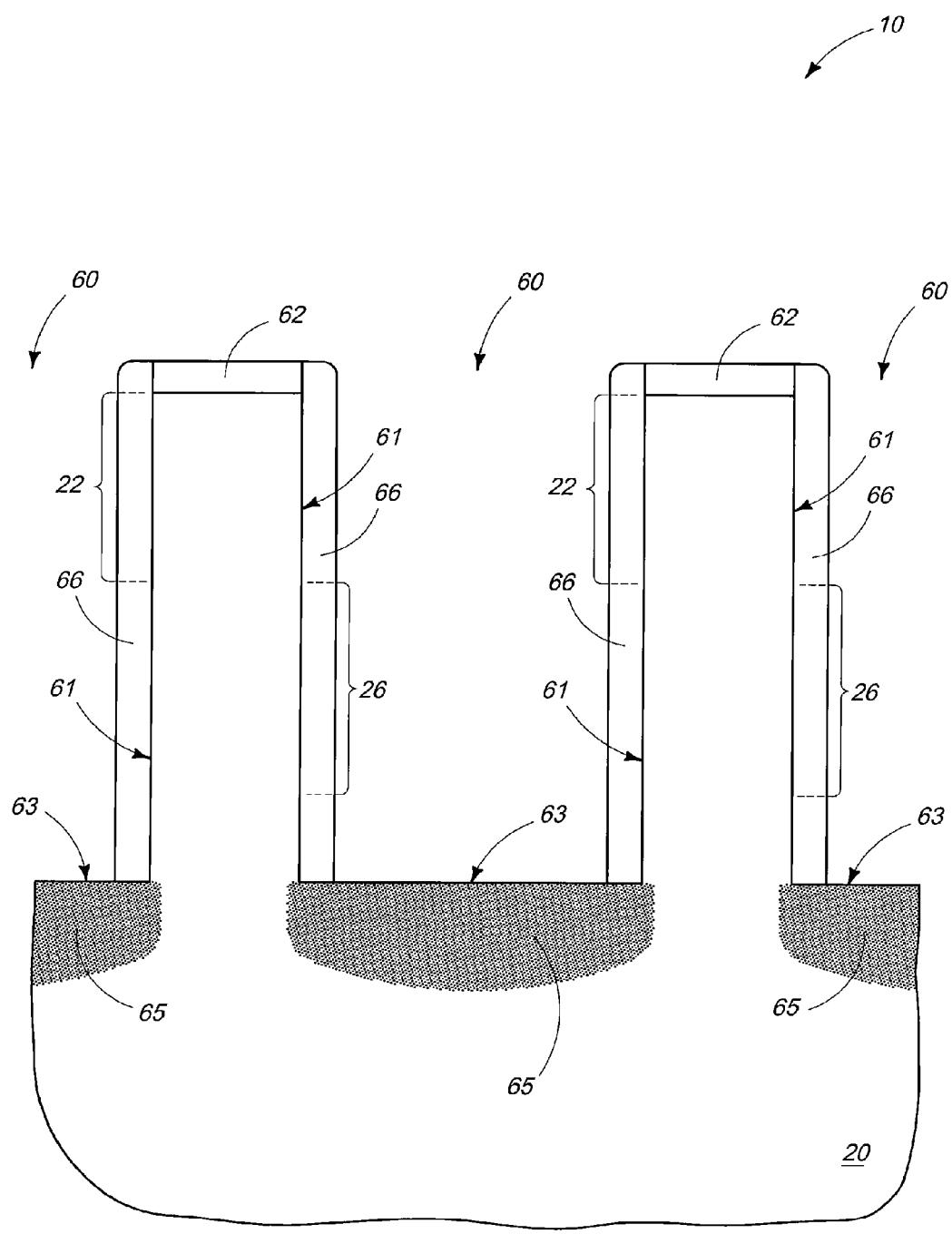
FIG. 3 is a view of the FIG. 2 substrate fragment at a processing step subsequent to that shown by FIG. 2.

Referring to FIG. 3, masking material 66 has been cleared from being received across trench bases 63 at least laterally between those portions of masking material 66 that are received laterally over elevational inner portions of sidewalls 61. Example techniques for doing so are by masked or maskless anisotropic etching of material 66 to remove such at least from horizontal surfaces. In one embodiment and as shown, such leaves masking material 66 that is laterally over the elevationally inner portions of sidewall 61 atop trench bases 63. In one embodiment and as shown, such etching may be conducted selectively relative to semiconductive material 20 underlying masking material 66.

FIG. 3 also depicts ion implanting of conductivity modifying impurity through trench bases 63 into semiconductive material 20 there-below, as indicated by stippled regions 65. The implanted impurity may spread laterally during implanting as-shown, and may implant into elevationally outermost portions of masking material 66 (not shown), into elevationally outermost portions of semiconductive material 20 between trenches 60 (not shown), and/or into any remaining masking material 62 (not shown). Regardless, the ion implanting may be by any suitable existing or yet-to-be-developed manner. Two existing example ion implanting methods are beam-line ion implanting and plasma doping, (i.e., sometimes referred to as PLAD). The ion implanted conductivity modifying impurity may be of at least one of n-type (for instance, phosphorus, arsenic, etc.) and p-type (for instance, boron, etc.). A specific example ion implant precursor for beam-line and/or PLAD for implanting boron is $B_2H_6$, although numerous others may be used. An example PLAD system may be an RF-excited continuous plasma with a DC pulsed bias substrate. Such ion implanting may utilize a doping gas of $B_2H_6/H_2$ with an implant voltage that may be typically within a range of from 0 to −15 KV, and with a dose that may be typically within a range of from about $1\times10^{16}$ atoms/cm$^2$ to about $1\times10^{17}$ atoms/cm$^2$ (for instance, about $3.5\times10^{16}$ atoms/cm$^2$), although others doses may be used.

Figure 4:
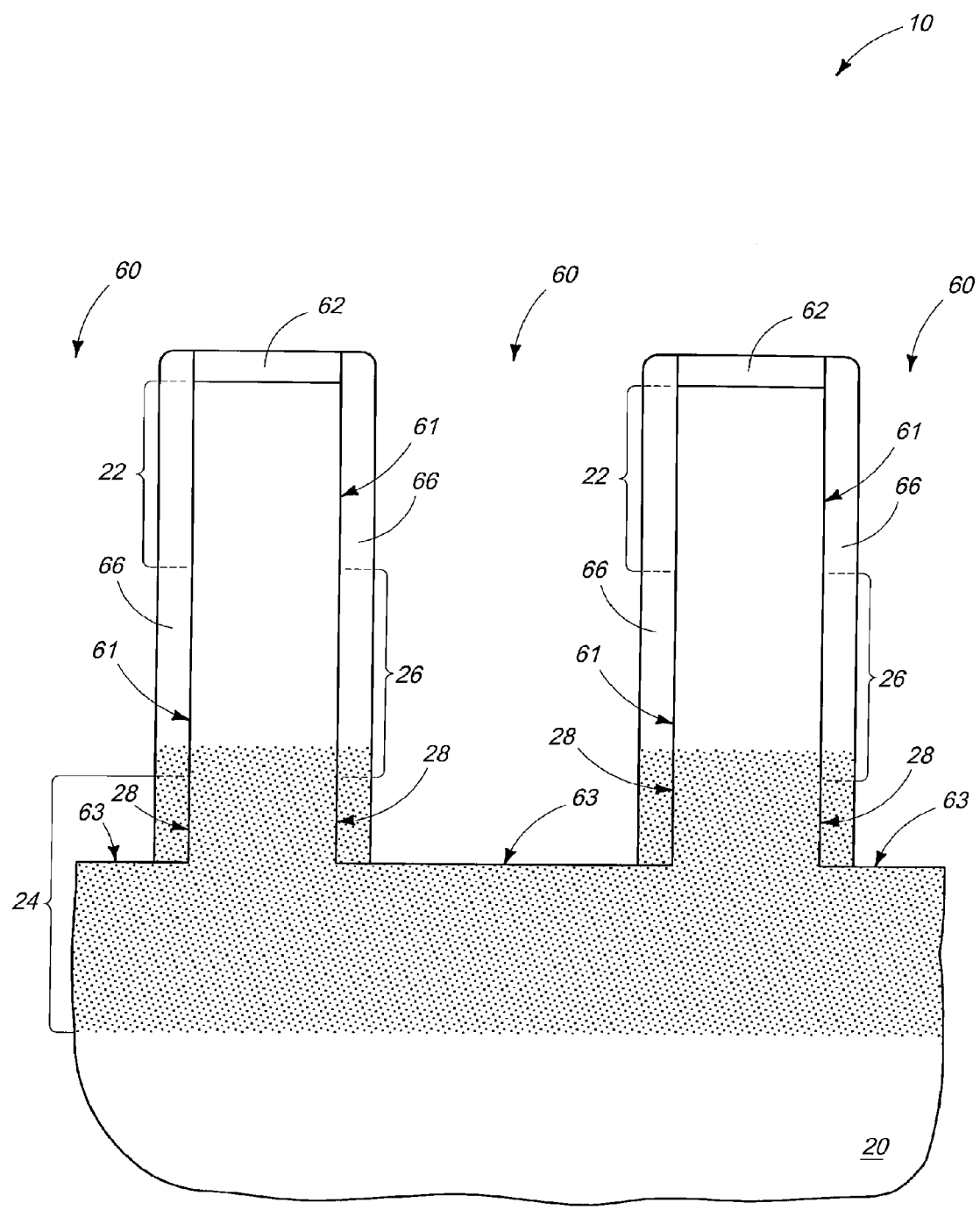
FIG. 4 is a view of the FIG. 3 substrate fragment at a processing step subsequent to that shown by FIG. 3.

Referring to FIG. 4, impurity from regions 65 of FIG. 3 has been diffused into masking material 66 that is received laterally over inner portions of sidewalls 61 and into semiconductive material 20 received between trenches 60 below mid-channel portion 26. An elevationally inner source/drain 24 is formed below mid-channel portion 26 within material 20. Such comprises semiconductive material 20 between trenches 60 which has the ion implanted conductivity modifying impurity therein. Accordingly, inner source/drain 24 below mid-channel portion 26 is ultimately effectively current conductive to function as a conductive source/drain region of the transistor component being formed. In one embodiment, the ion implanting is conducted while at least the elevationally inner portions of the trench sidewalls have masking material laterally there-over. Regardless, inner source/drain 24 may be considered as having opposing laterally outer sides 28.

An example technique for imparting the above-described diffusion is by subjecting the substrate to a sufficiently high temperature for a suitable period of time to cause such dopant impurities to so-diffuse. By way of example only, such may be achieved by annealing at from 500° C. to 1,000° C. for from five seconds to two hours. Where, for example, such conductivity modifying impurity of inner source/drain 24 derives essentially entirely from initial implanted regions 65 of FIG. 3, dopant concentration therein may be chosen by the artisan to be suitably high such that the resultant source/drain 24 of FIG. 4 is sufficiently doped to be current conductive. Additionally or alternately, in some embodiments the conductivity modifying impurity within inner source/drain 24 of material 20 may be provided therein by other manner(s) than diffusion of ion implanted impurity, and whether existing or yet-to-be-developed. Where masking material 66 is dielectric, dopant diffusion therein may inherently be unable to render such doped material to be current conductive due the dielectric nature of material 66. Regardless, is some embodiments masking material 66 may remain as part of the finished circuitry construction. In some embodiments, impurity may not diffuse into masking material 66.

Figure 5:
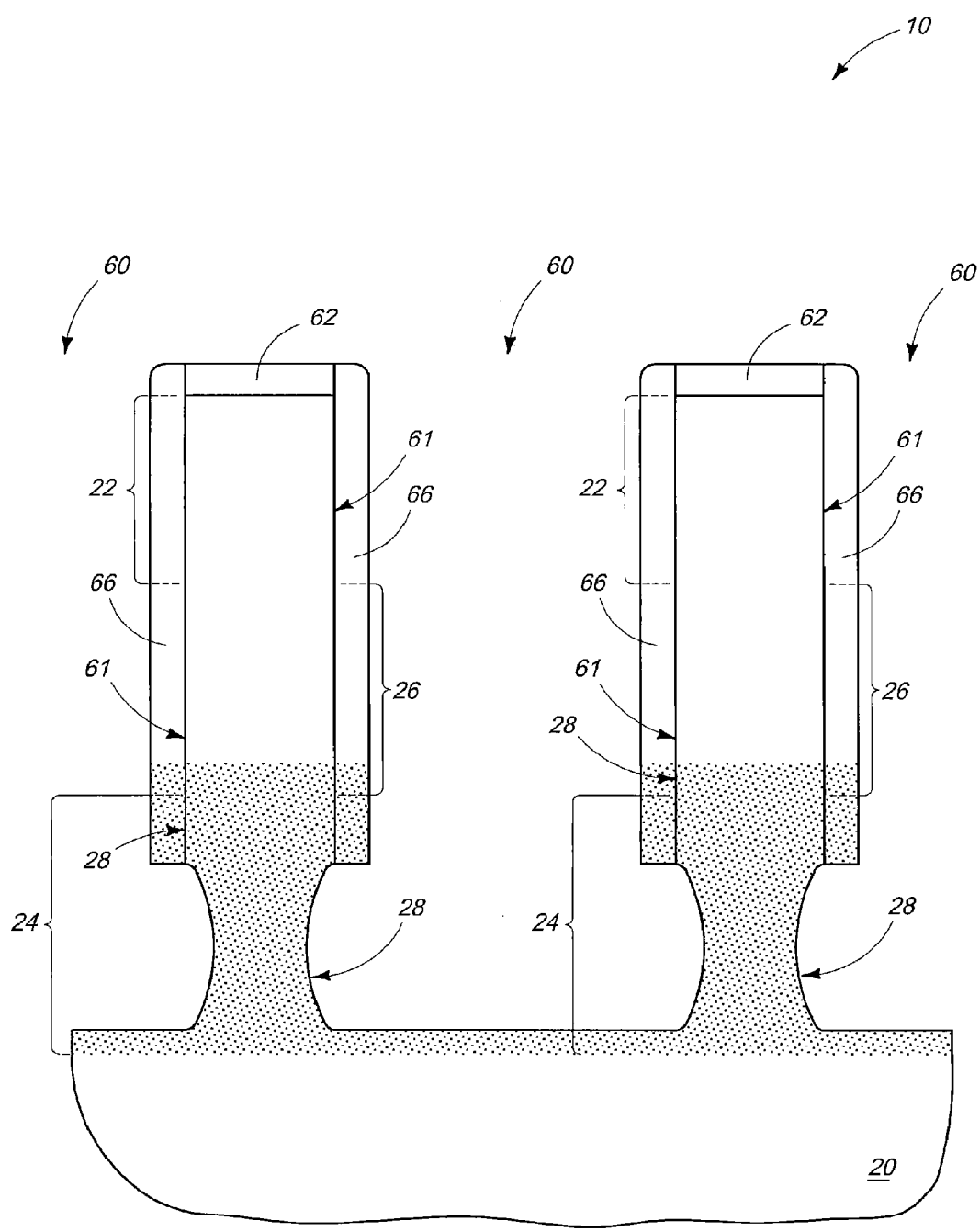
FIG. 5 is a view of the FIG. 4 substrate fragment at a processing step subsequent to that shown by FIG. 4.

Referring to FIG. 5, trenches 60 have been etched deeper (elevationally inward) into semiconductive material 20. In one embodiment and as shown, such deeper etching of trenches 60 may etch semiconductive material 20 between the deepened trenches laterally inward as well as elevationally inward. Such may be conducted by any existing or yet-to-be-developed wet and/or dry etching technique.

Figure 6:
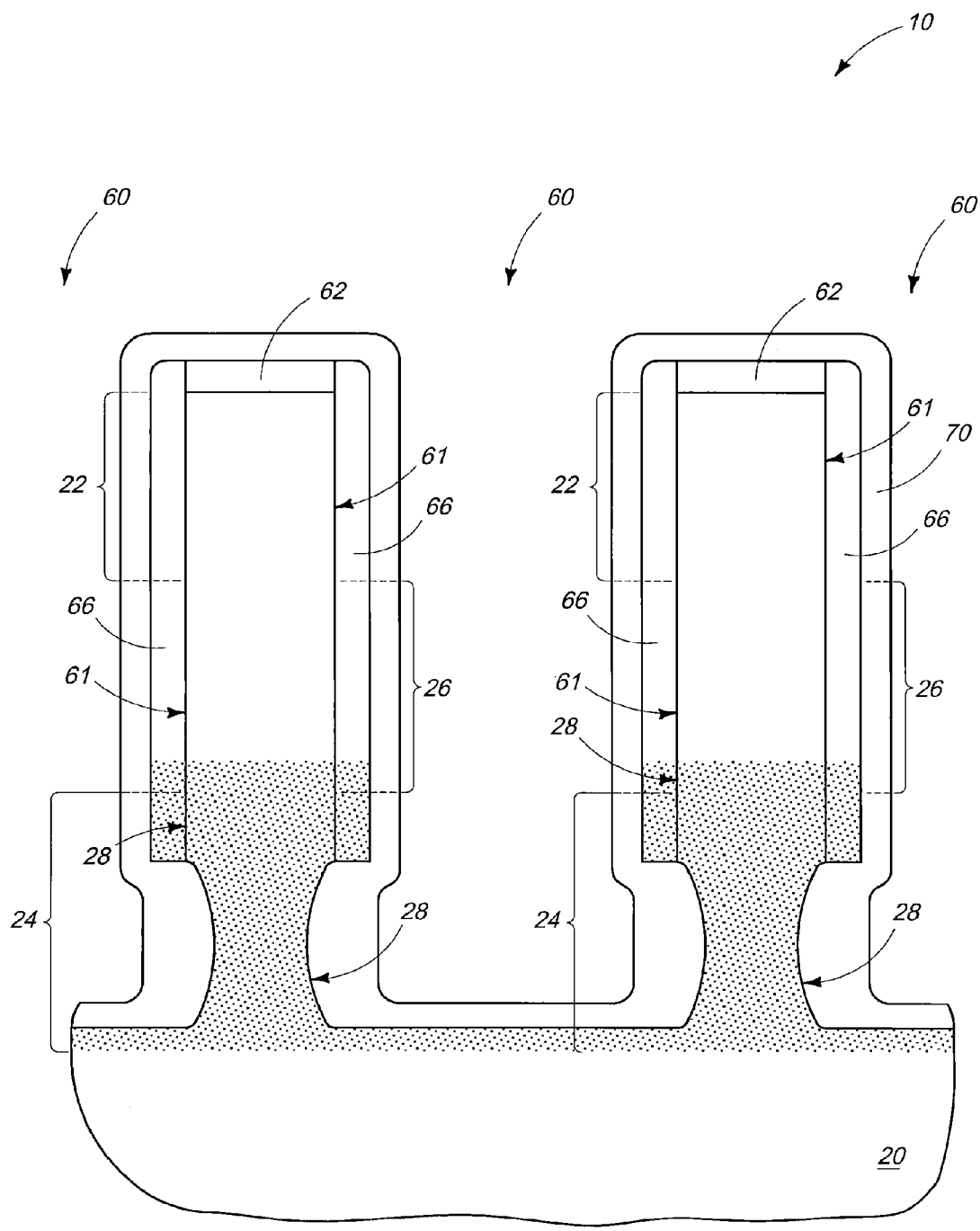
FIG. 6 is a view of the FIG. 5 substrate fragment at a processing step subsequent to that shown by FIG. 5.

Referring to FIG. 6, conductive material 70 has been deposited to line the masked portions of trench sidewalls 61 and to line the bases and sidewalls of the deepened portion of trenches 60. Conductive material 70 may less-than-fill deepened trenches 60. Conductive material 70 may be homogenous or non-homogenous, with example materials being elemental metals, alloys of elemental metals, conductive metal compounds, and/or conductively doped semiconductive material. Titanium nitride is but one example.

Figure 7:
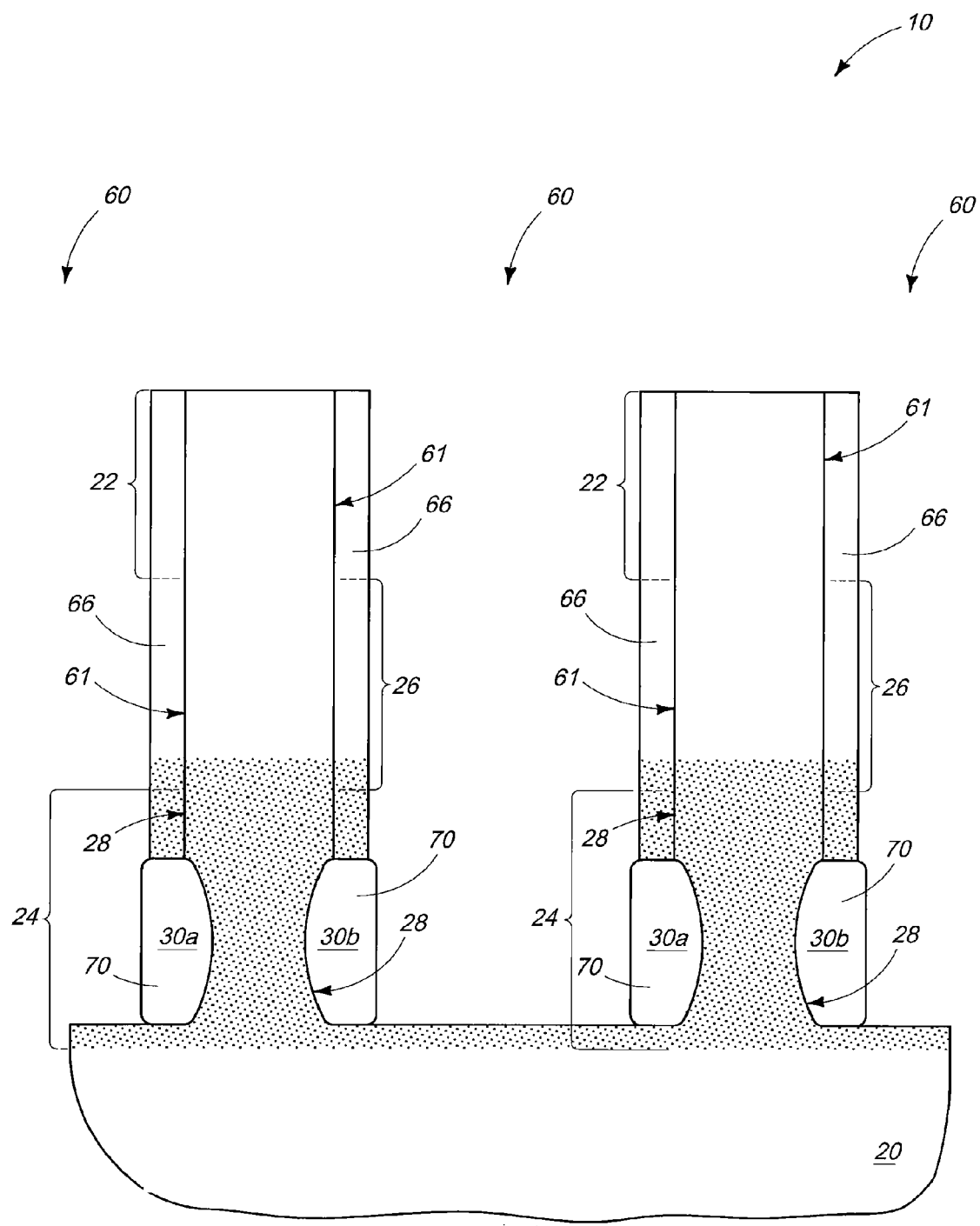
FIG. 7 is a view of the FIG. 6 substrate fragment at a processing step subsequent to that shown by FIG. 6.

Referring to FIG. 7, conductive material 70 has been etched from being received over the masked portions of trench sidewalls 61 and from being centrally received over the deepened trench bases. Such may be conducted in a masked or mask-less manner. Such etching has formed pairs of conductive lines 30a, 30b within the deepened trenches laterally against and electrically coupled to opposing sides of conductively doped semiconductive material 20 received between deepened trenches 60. In the context of this document, devices or components are electrically coupled relative one another if electric current continuously flows from one to the other predominantly by movement of subatomic positive and/or negative charges when such are generated as opposed to predominantly by movement of ions. Masking material 62 (not shown) has been removed in FIG. 7, and such may be wholly or partially removed earlier, or not at all.

The processing with respect to FIGS. 5-7 is but one example embodiment of forming a conductive line laterally over and electrically coupled to at least one of opposing sides 28 of inner source/drain 24, with two example conductive lines 30a, 30b being electrically coupled to both of opposing sides 28 of inner source/drain 24. In one embodiment, conductive lines 30a, 30b may be hard-wired together, thereby operating at the same potential in tandem.

Figure 8:
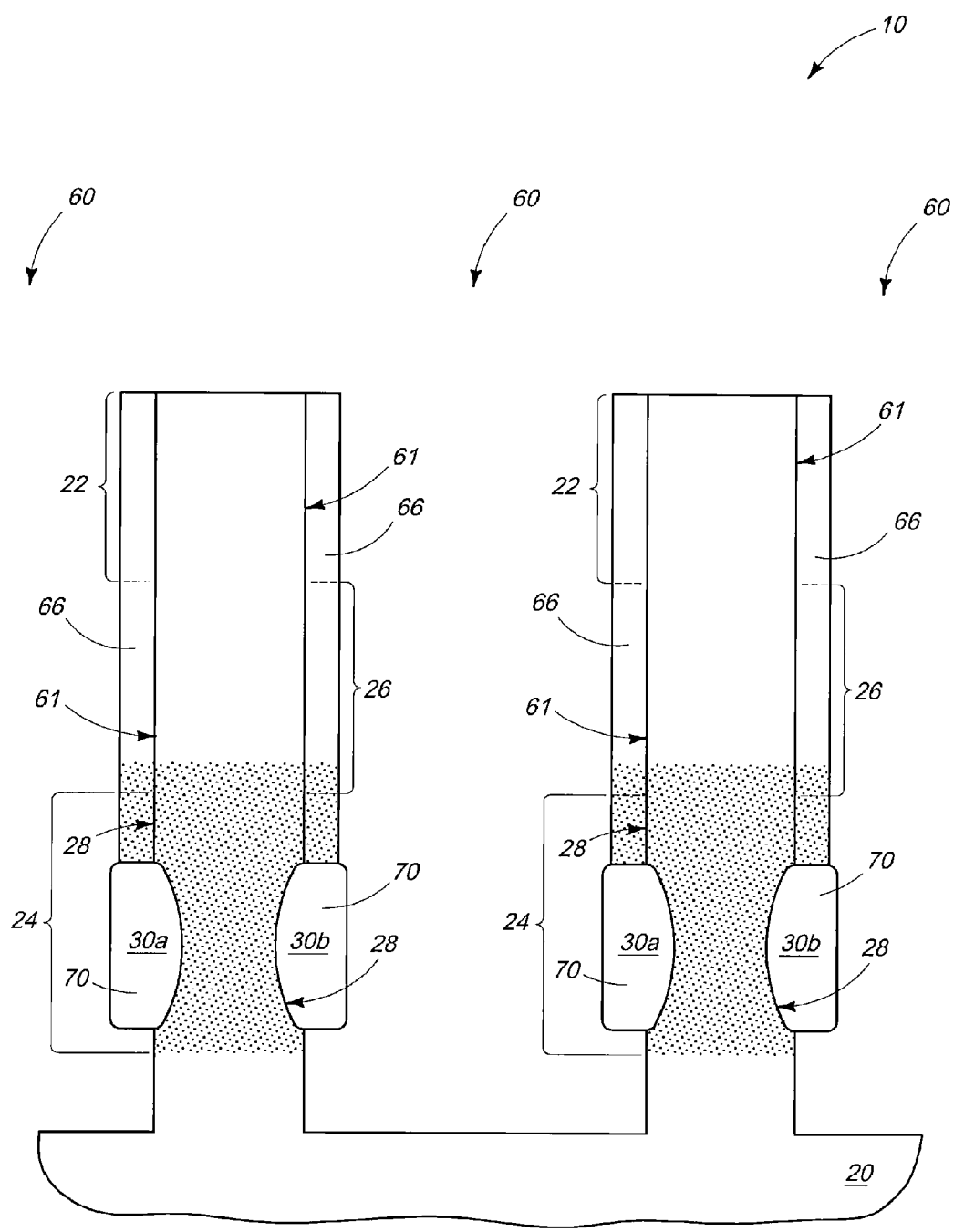
FIG. 8 is a view of the FIG. 7 substrate fragment at a processing step subsequent to that shown by FIG. 7.

Referring to FIG. 8, trenches 60 have been etched deeper into semiconductive material 20 and elevationally through the conductively doped region/portion thereof (not shown) which was at the bases of the deepened trenches resulting from the example FIG. 5 etching. Some or all of material 66 may remain or be removed.

Figure 9:
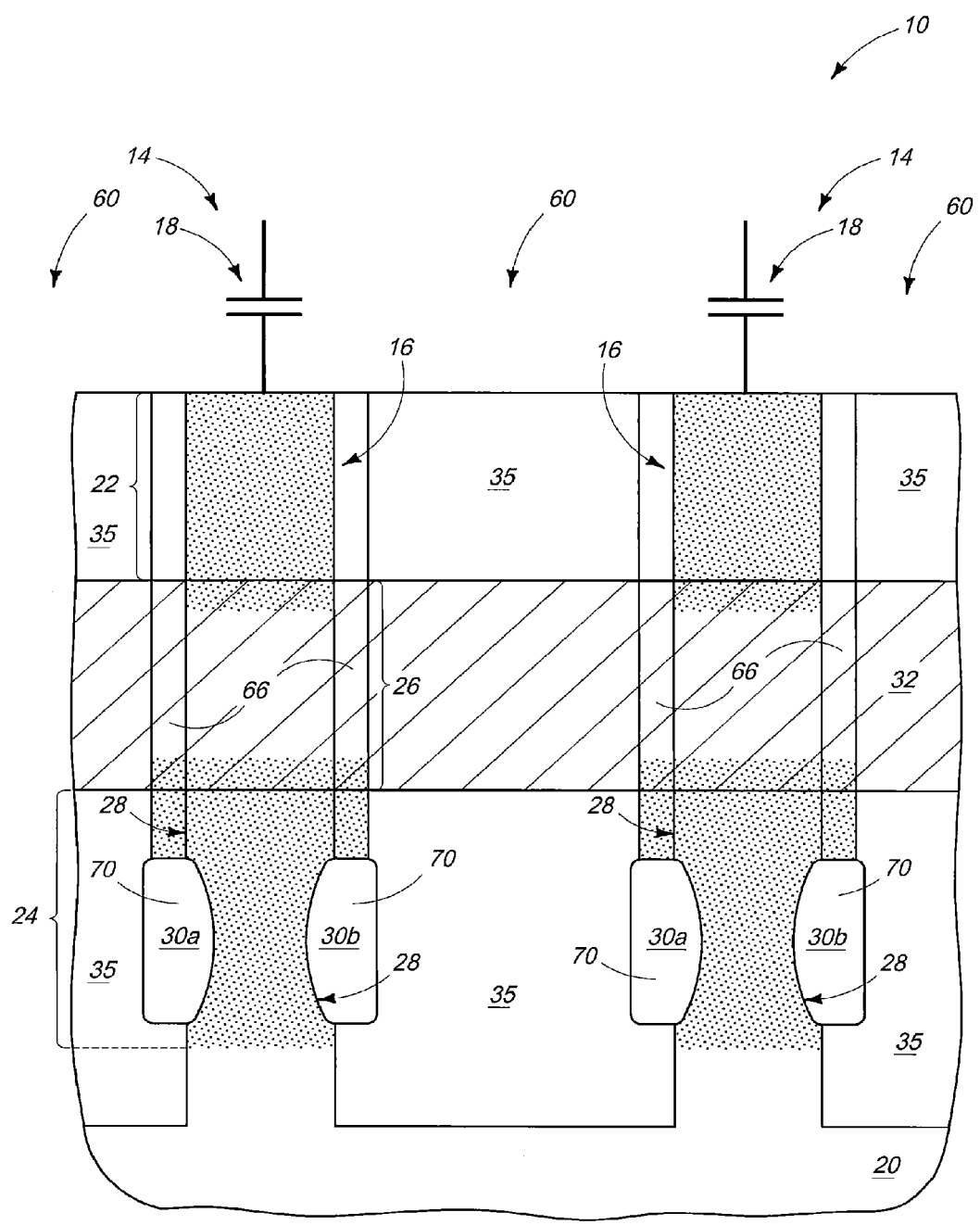
FIG. 9 is a view of the FIG. 8 substrate fragment at a processing step subsequent to that shown by FIG. 8, and is a hybrid schematic and fragmentary structural view of a portion of an integrated circuit.

Referring to FIG. 9, a gate 32 has been formed elevationally outward of and spaced from conductive lines 30a, 30b and laterally adjacent mid-channel portion 26 of semiconductive material 20, and thereby elevationally outward of conductively doped inner source/drain 24 of semiconductive material 20 between trenches 60. In one embodiment and as shown, the gate may be provided in the form of a gate line 32. Other gate constructions may be used. A suitable gate dielectric (not shown/viewable in FIG. 9) would be provided laterally between the gate/gate line and semiconductive channel portion 26 prior to formation of gate/gate line 32. Suitable dielectric material 35 is shown filling remaining volume of trenches 60 above and below gate line 32. Dielectric 35 may be homogenous or non-homogenous, with silicon nitride and boron and/or phosphorus doped silicon dioxide being examples. By way of example only, the gate dielectric and gate line 32 may be formed over the depicted planarized lower dielectric material 35. FIG. 9 shows elevationally outer source/drain portion 22 as having been suitably conductively doped to be effectively current conductive. Thus, a vertical transistor 16 is formed having at least one conductive line 30a or 30b electrically coupled therewith.

In one embodiment, vertical transistor 16 comprises part of a memory cell 14, with such in one embodiment including a charge storage device 18 which is electrically coupled to outer source/drain 22. Charge storage device 18 is depicted schematically as being a capacitor, although other existing or yet-to-be-developed devices may be used.

In one embodiment, an array of memory cells is formed which comprises rows and columns. A plurality of conductive lines (i.e., 30a, 30b) extends along columns of the array. A plurality of access lines (i.e., 32) extend along rows of the array, with individual of the gates comprising a respective portion of a respective one of the plurality of access lines. For example referring to FIGS. 9 and 10, substrate fragment 10 comprises a memory array circuitry area 12 comprising a plurality of individual memory cells 14. In one embodiment, the depicted circuitry may be configured as Dynamic Random Access Memory (DRAM). Memory array 12 comprises an array of immediately adjacent pairs of electrically coupled data/sense lines 30a, 30b on opposite lateral sides 28 of source/drain regions 24. Data/sense lines 30a and 30b of an individual pair of such data/sense lines may be electrically coupled to one another other than solely through inner source/drain region 24. For example, such may be so coupled outside of the FIG. 9 view within the array and/or peripherally of the array. For example, data/sense lines 30a, 30b of an individual pair might be electrically coupled at or adjacent longitudinal ends thereof by a metal interconnect 33. One of data/sense lines 30a or 30b of the individual pairs of such lines is electrically coupled to and against one of outer sides 28 of inner source/drain region 24 of individual memory cells 14, with the other of such lines 30a or 30b of the individual pairs being electrically coupled to and against the other of outer sides 28 of inner source/drain region 24 of individual memory cells 14.

An array of access gate lines 32 is provided elevationally outward of the array of data/sense line pairs 30a, 30b. Such are received operatively adjacent channel region 26 of individual memory cells 14, with a gate dielectric 34 (FIG. 10) being provided laterally between individual access gate lines 32 and respective channel portions 26. Dielectric material 35 is shown as surrounding transistors 16 and date/sense lines 30a, 30b. Access gate lines 32 in FIG. 10 are shown with diagonal hatching for distinguishing clarity in FIG. 10, although such is received within dielectric material 35 as shown in FIG. 9.

Memory cells 14 of memory array 12 may be considered as extending along respective lines 50 which run parallel data/sense lines 30a, 30b of a pair of such lines. Material of inner source/drain regions 24 of individual memory cells 14 may electrically couple with the inner source/drain regions of other memory cells respectively extending along a given line 50 of such memory cells. For example and by way of example only, inner source/drain regions 24 may be formed as a continuously doped region of semiconductive material 20 along the respective lines 50. Alternately in one embodiment, inner source/drain regions 24 of individual memory cells 14 may be electrically isolated from the inner source/drain regions of the other memory cells which respectively extend along lines 50 of such memory cells. For example, each inner source/drain region 24 may be an isolated/spaced conductively doped region of semiconductive material 20 along the respective lines 50.

Figure 10:
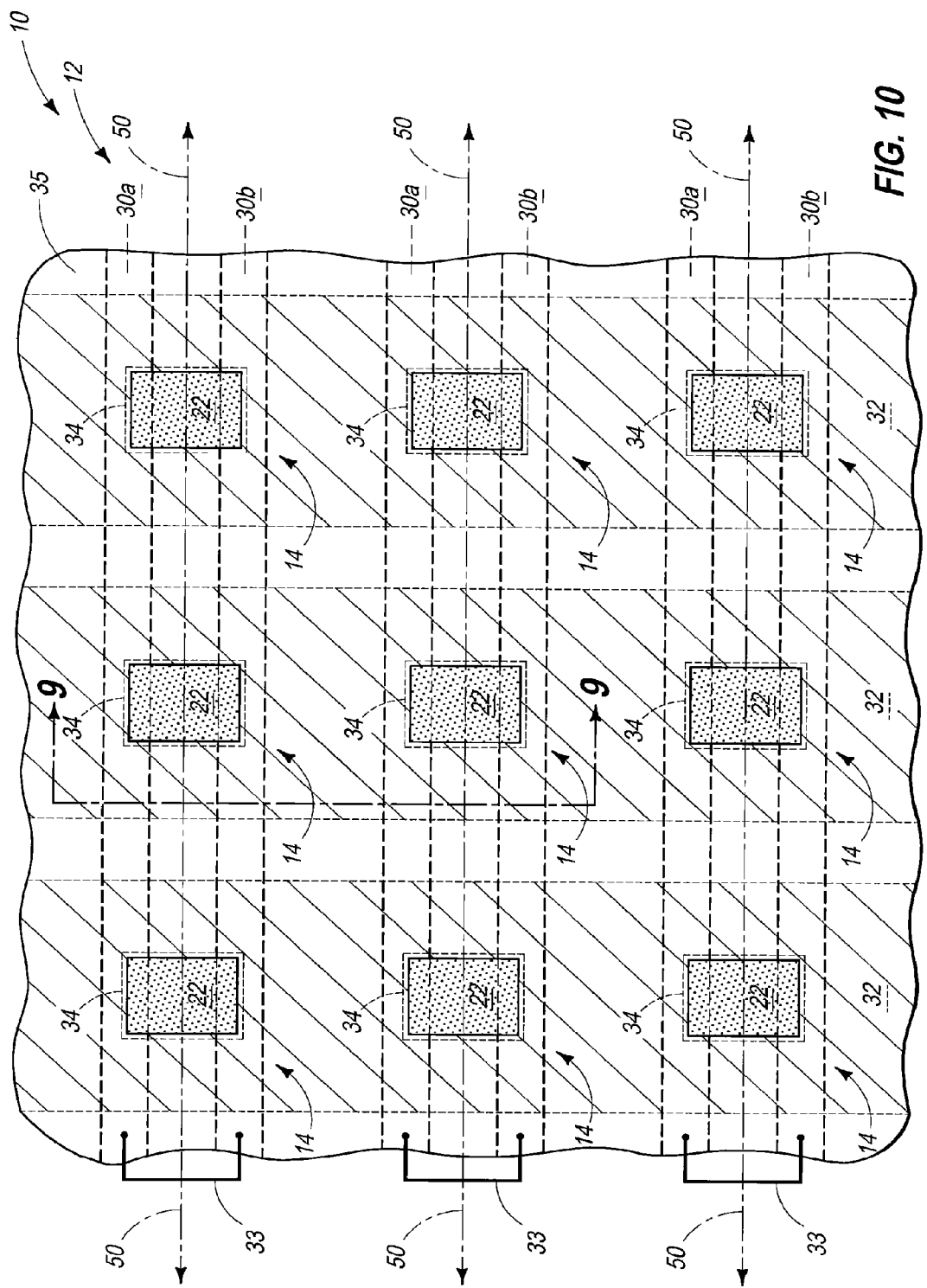
FIG. 10 is a diagrammatic top plan view of an array of memory cells, with FIG. 9 comprising a sectional view of FIG. 10 taken through line 9-9.
Figure 11:
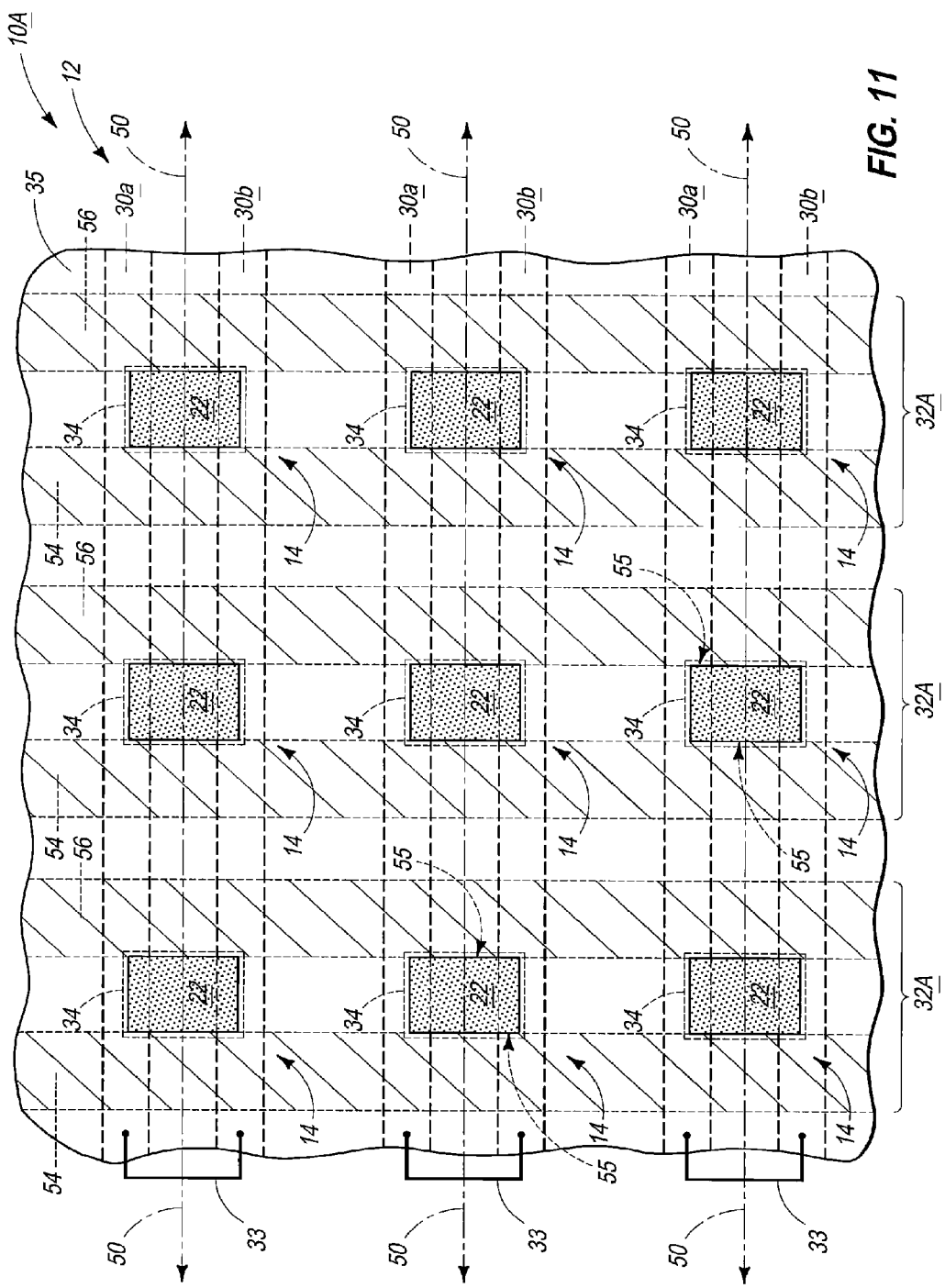
FIG. 11 is a diagrammatic top plan view of an alternate embodiment array of memory cells to that depicted in FIG. 10.

FIG. 10 depicts an example embodiment where individual access gate lines 32 are "wrap-around" gate line constructions wherein all lateral sides of a respective channel region 26 are surrounded by gate dielectric 34 and conductive gating material shown by the diagonal hatching. FIG. 11 depicts an alternate example embodiment access gate line 32A of a substrate fragment 10A. Like numerals from the first-described embodiment have been utilized where appropriate, with some construction differences being indicated with suffix "A" or with different numerals. Access gate lines 32A within array circuitry area 12 respectively comprise a pair of electrically coupled access gate lines 54, 56 which are received elevationally outward of the respective pairs of electrically coupled data/sense lines 30a, 30b. One of gate lines 54 or 56 of each pair is operatively received laterally over one of opposing outer lateral sides 55 of channel region 26, with the other of lines 54 or 56 of each pair being operatively laterally over the other of such outer sides 55 of channel region 26. In one embodiment, opposing laterally outer sides 55 of channel region 26 are transversely oriented relative to opposing laterally outer sides 28 of inner source/drain region 24. Lines 54, 56 of each such pair 32A may be electrically coupled to one another (not shown), for example outside of the FIG. 11 view.

Figure 12:
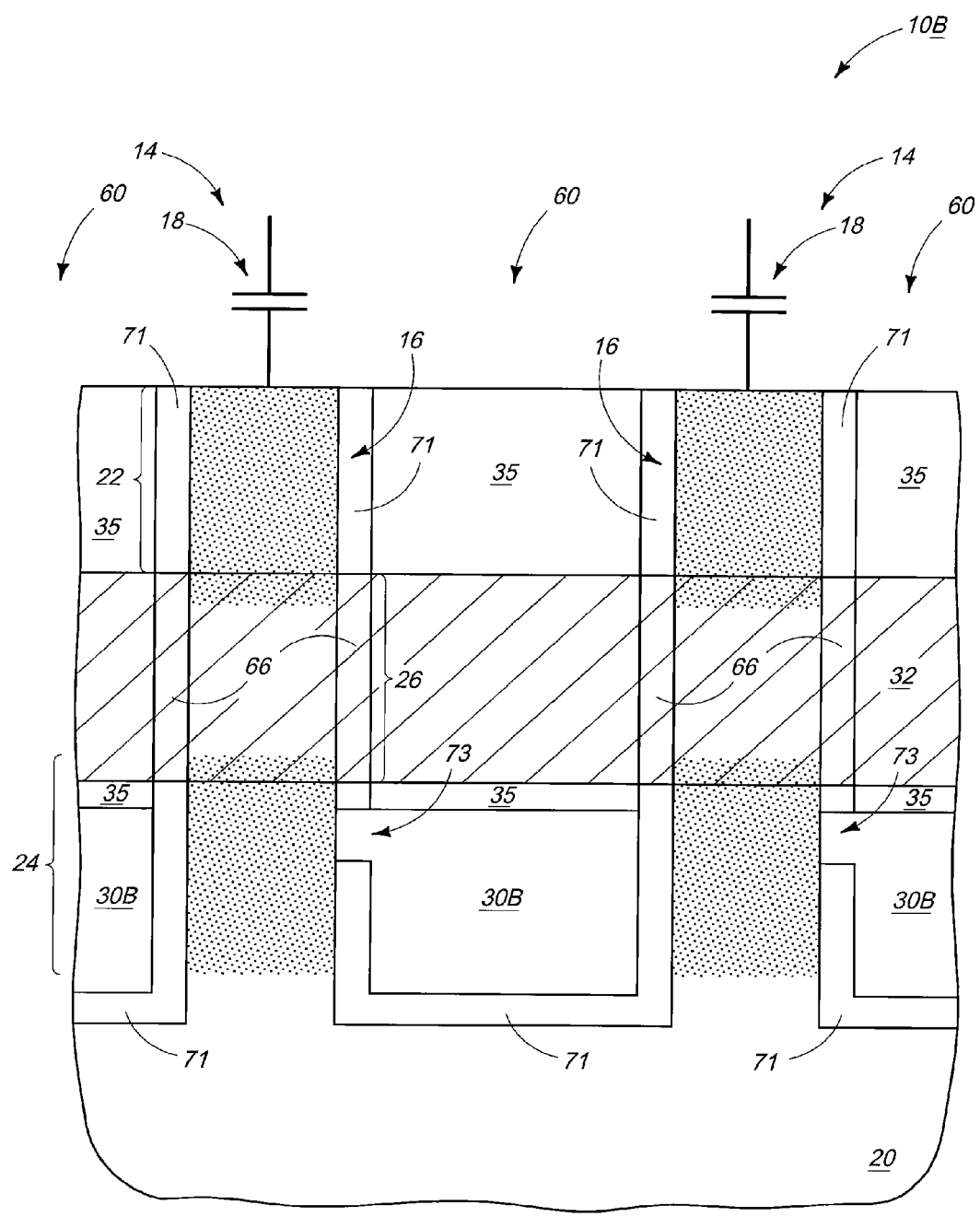
FIG. 12 is a view of an alternate embodiment to that depicted in FIG. 9.

The above example embodiments show a conductive line which is laterally over and electrically coupled to both of the opposing sides of the inner source/drain. However, embodiments of the invention encompass a conductive line laterally over and electrically coupled to at least one of such sides, for example with respect to a single line over a single side as shown with respect to a substrate fragment 10B in FIG. 12. Like numerals from the above-described embodiments have been used where appropriate, with some construction differences being indicated with the suffix "B" or with different numerals. Trenches 60 are shown as ultimately having been lined with a suitable dielectric 71, with a lateral opening 73 formed there-through to elevationally inner source/drain 24. A conductive line 30B has ultimately been formed within trenches 60, and which is electrically coupled to inner source/drain 24 through opening 73. Accordingly, FIG. 12 shows but one example embodiment wherein only one conductive line has been formed laterally over and electrically coupled to only one of opposing sides of a respective inner source/drain 24.

The above-described processing with respect to FIG. 3 conducted the ion implanting of the conductivity modifying impurity through the trench bases into semiconductive material there-below after masking material 66 had been cleared from being received across bases 63 at least laterally between the masking material received laterally over elevationally inner portions of sidewalls 61. Alternately, such ion implanting may be conducted through such masking material which is received over the trench bases, and in one embodiment regardless of whether subsequent diffusing of such impurity occurs relative to material 20 or into material 66. One example embodiment is described with reference to FIGS. 13 and 14, and substrate fragment 10C shown therein. Like numerals from the above-described embodiments have been used where appropriate, with some construction differences being indicated with the suffix "C" or with different numerals.

Figure 13:
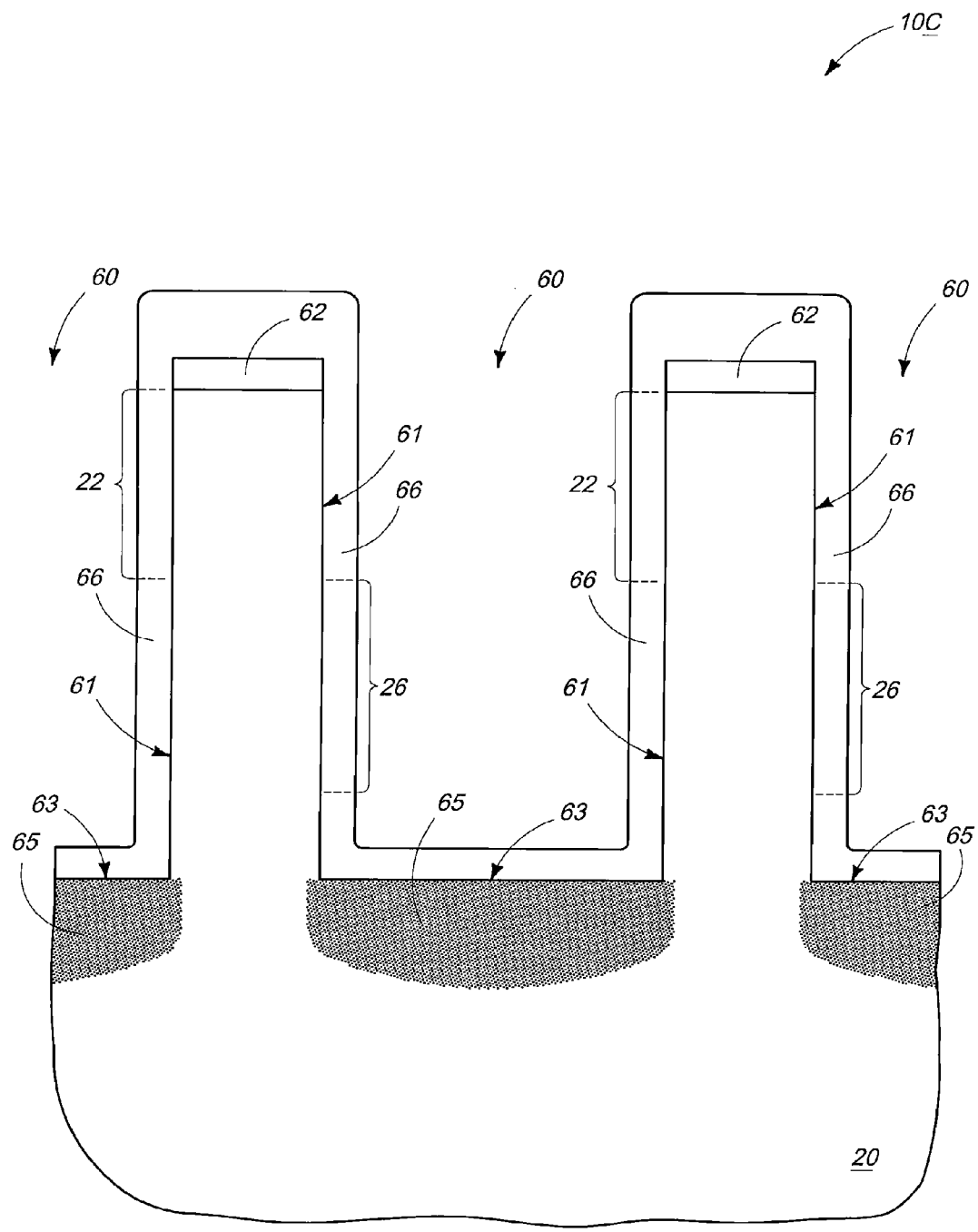
FIG. 13 is a diagrammatic sectional view of another substrate fragment in process in accordance with an embodiment of the invention, and is an alternate to that shown in FIG. 3.
Figure 14:
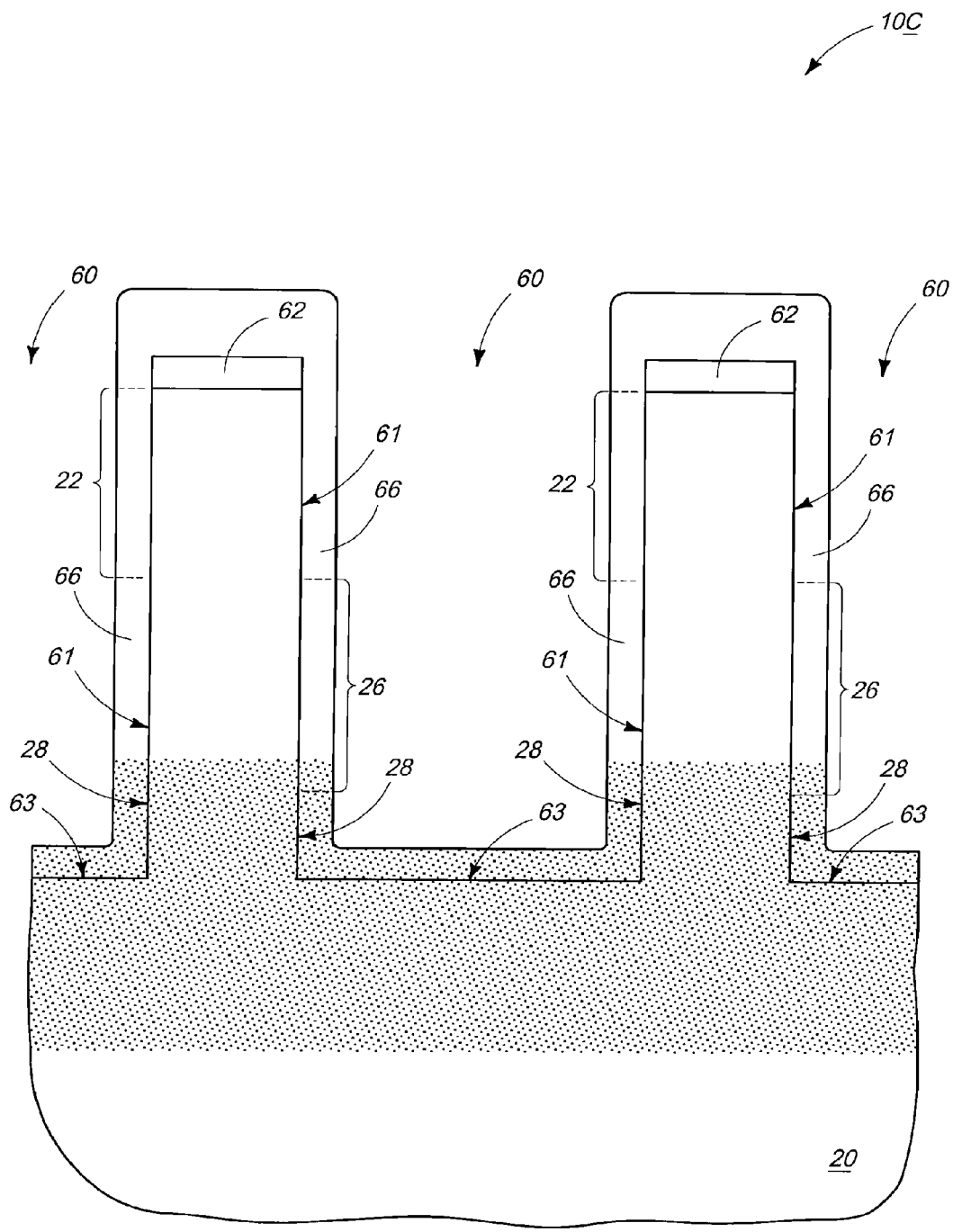
FIG. 14 is a view of the FIG. 13 substrate fragment at a processing step subsequent to that shown by FIG. 13.

FIG. 13 depicts ion implanting as having been conducted through that portion of masking material 66 received over trench bases 63 to form implant regions 65. Some of regions 65 as-implanted may extend into some or all (not shown) of masking material 66 thereover. Regardless, in one embodiment where subsequent diffusion of such impurity occurs, such may occur into masking material 66 that is received laterally over elevationally inner portions of trench sidewalls 61, and in one embodiment into masking material 66 received across trench bases 66. Such is shown by way of example only in FIG. 14. Subsequent processing may occur as described above with respect to FIG. 5+, or otherwise. Further and regardless, any subsequent etching which may be conducted through masking material 66 received across trench bases 63 may be conducted before or after the example diffusing depicted by FIG. 14.

Figure 15:
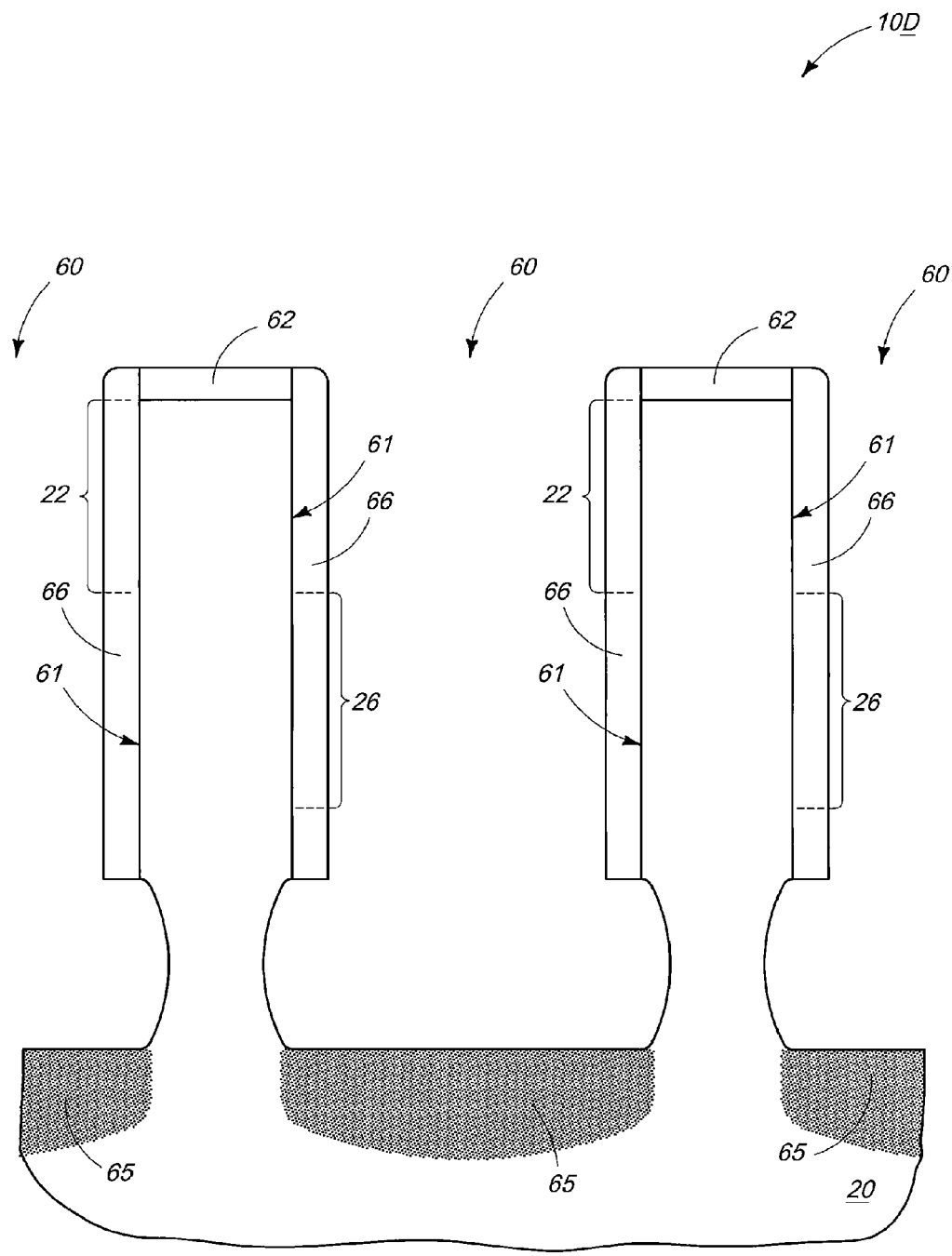
FIG. 15 is a diagrammatic sectional view of another substrate fragment in process in accordance with an embodiment of the invention, and is an alternate to that shown in FIG. 3.

The above-illustrated embodiments show examples where multiple etching steps may be used to ultimately form trenches 60. Such embodiments also, by way of examples only, show processing wherein the ion implanting of conductivity modifying impurity is conducted prior to etching the trenches deeper into the semiconductive material. An alternate example embodiment is described with respect to a substrate fragment 10D in FIGS. 15 and 16. Like numerals from the above-described embodiments have been used where appropriate, with some construction differences being indicated with suffix "D" or with different numerals. FIG. 15 depicts alternate example processing to that shown in FIG. 3. Specifically, after masking material 66 has been formed, trenches 60 have been etched deeper into semiconductive material 20. By way of example only, such etching has been conducted to correspond to the profile depicted in FIG. 5, although other profiles may be used or result. Thereafter, ion implanting of conductivity modifying impurity has been conducted through bases of the deepened trenches into semiconductive material 20 there-below to form implant regions 65.

Figure 16:
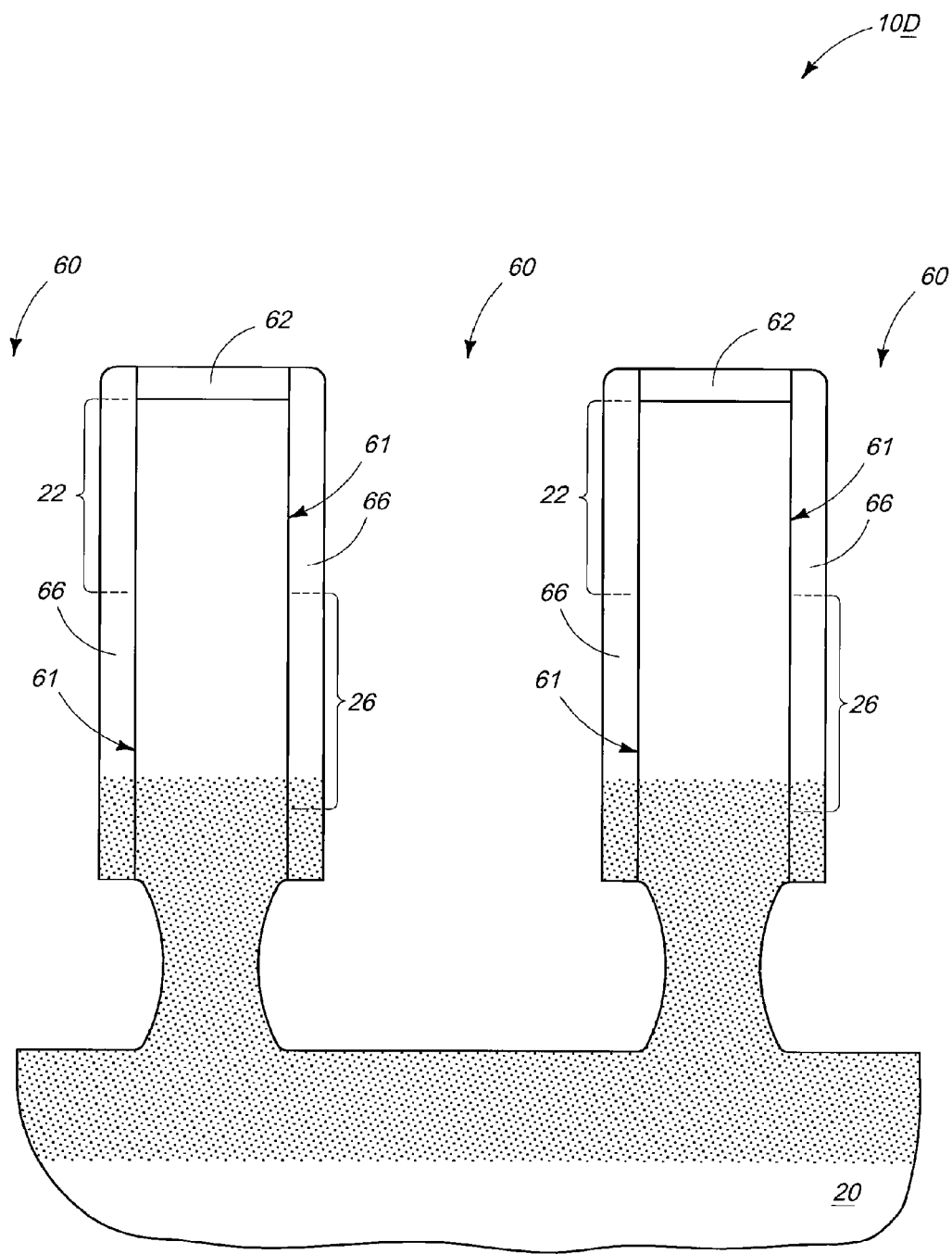
FIG. 16 is a view of the FIG. 15 substrate fragment at a processing step subsequent to that shown by FIG. 15.

Referring to FIG. 16, such impurity has been diffused into semiconductive material 20 received between trenches 60 below mid-channel portion 26, and into masking material 66 received laterally over elevationally inner portions of sidewalls 61 of trenches 60. Processing may occur subsequently as described with respect to FIG. 6+, or otherwise.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a vertical transistor and at least a conductive line electrically coupled therewith, comprising:
    forming trenches in semiconductive material, the semiconductive material between the trenches comprising an elevationally outer source/drain portion and an elevationally mid-channel portion there-below;
    forming masking material laterally over at least elevationally inner sidewall portions of the trenches;
    ion implanting conductivity modifying impurity through bases of the trenches into semiconductive material there-below;
    diffusing the impurity into the masking material received laterally over the elevationally inner sidewall portions of the trenches and into semiconductive material received between the trenches below the mid-channel portion, and forming an elevationally inner source/drain below the mid-channel portion, the inner source/drain comprising said semiconductive material between the trenches which has the impurity therein;
    forming a conductive line laterally over and electrically coupled to at least one of opposing sides of the inner source/drain; and
    forming a gate elevationally outward of and spaced from the conductive line and laterally adjacent the mid-channel portion, a gate dielectric being provided laterally between the gate and the mid-channel portion.

2. The method of claim 1 wherein the ion implanting is by beam-line ion implanting.

3. The method of claim 1 wherein the ion implanting is by plasma doping.

4. The method of claim 1 comprising forming a conductive line laterally over and electrically coupled to only one of the opposing sides of the inner source/drain.

5. The method of claim 1 comprising forming a conductive line laterally over and electrically coupled to both of the opposing sides of the inner source/drain.

6. The method of claim 5 wherein the conductive lines formed over both of the opposing sides of the inner source/drain are hard-wired together.

7. The method of claim 1 wherein the masking material is received laterally over at least elevationally inner sidewall portions of the trenches during the ion implanting.

8. The method of claim 1 comprising after forming the conductive line, etching through an implant region in semiconductive material below the trenches formed by said ion implanting to deepen the trenches within the semiconductive material.

9. The method of claim 8 wherein the etching is substantially anisotropic.

10. The method of claim 1 comprising forming the vertical transistor to comprise part of a memory cell, and forming a charge storage device of the memory cell which is electrically coupled to the outer source/drain portion.

11. The method of claim 10 comprising:
forming an array of the memory cells comprising rows and columns;
forming a plurality of said conductive lines extending along columns of the array; and
forming a plurality of access lines extending along rows of the array, individual of the gates comprising a respective portion of a respective one of the plurality of access lines.

12. A method of forming a vertical transistor and at least a conductive line electrically coupled therewith, comprising:
forming trenches in semiconductive material, the semiconductive material between the trenches comprising an elevationally outer source/drain portion and an elevationally mid-channel portion there-below;
forming masking material across bases of the trenches and laterally over at least elevationally inner sidewall portions of the trenches;
clearing the masking material from being received across the bases at least laterally between the masking material received laterally over the elevationally inner sidewall portions;
after the clearing, ion implanting conductivity modifying impurity through the trench bases into semiconductive material there-below,
diffusing the impurity into the masking material received laterally over the elevationally inner sidewall portions of the trenches and into semiconductive material received between the trenches below the mid-channel portion, and forming an elevationally inner source/drain below the mid-channel portion, the inner source/drain comprising said semiconductive material between the trenches which has the impurity therein;
forming a conductive line laterally over and electrically coupled to at least one of opposing sides of the inner source/drain; and
forming a gate elevationally outward of and spaced from the conductive line and laterally adjacent the mid-channel portion, a gate dielectric being provided laterally between the gate and the mid-channel portion.

13. The method of claim 12 wherein the clearing comprises etching.

14. The method of claim 13 wherein the etching is substantially anisotropic leaving masking material received laterally over the elevationally inner sidewall portions atop the bases.

15. The method of claim 13 wherein the etching is conducted selectively relative to the semiconductive material underlying the masking material.

16. The method of claim 12 comprising after the clearing, etching the trenches deeper into the semiconductive material.

17. The method of claim 16 wherein the etching is conducted after the diffusing.

18. The method of claim 12 comprising after forming the conductive line, etching through an implant region in semiconductive material below the trenches formed by said ion implanting to deepen the trenches within the semiconductive material.

19. The method of claim 12 comprising:
forming the vertical transistor to comprise part of a memory cell, and forming a charge storage device of the memory cell which is electrically coupled to the outer source/drain portion;
forming an array of the memory cells comprising rows and columns;
forming a plurality of said conductive lines extending along columns of the array; and
forming a plurality of access lines extending along rows of the array, individual of the gates comprising a respective portion of a respective one of the plurality of access lines.

20. A method of forming a vertical transistor and at least a conductive line electrically coupled therewith, comprising:
forming trenches in semiconductive material, the semiconductive material between the trenches comprising an elevationally outer source/drain portion and an elevationally mid-channel portion there-below;
forming masking material laterally over at least elevationally inner sidewall portions of the trenches;
after forming the masking material, etching the trenches deeper into the semiconductive material;
after the etching, ion implanting conductivity modifying impurity through bases of the deepened trenches into semiconductive material there-below;
diffusing the impurity into the masking material received laterally over the elevationally inner sidewall portions of the trenches and into semiconductive material received between the trenches below the mid-channel portion, and forming an elevationally inner source/drain below the mid-channel portion, the inner source/drain comprising said semiconductive material between the trenches which has the impurity therein;
forming a conductive line laterally over and electrically coupled to at least one of opposing sides of the inner source/drain; and
forming a gate elevationally outward of and spaced from the conductive line and laterally adjacent the mid-channel portion, a gate dielectric being provided laterally between the gate and the mid-channel portion.

21. The method of claim 20 wherein the etching is substantially anisotropic.

22. The method of claim 20 wherein the etching also etches semiconductive material laterally inward between the deepened trenches.

23. The method of claim 20 comprising:
forming the vertical transistor to comprise part of a memory cell, and forming a charge storage device of the memory cell which is electrically coupled to the outer source/drain portion;
forming an array of the memory cells comprising rows and columns;
forming a plurality of said conductive lines extending along columns of the array; and
forming a plurality of access lines extending along rows of the array, individual of the gates comprising a respective portion of a respective one of the plurality of access lines.

* * * * *